(12) United States Patent
Gupta et al.

(10) Patent No.: US 7,547,360 B2
(45) Date of Patent: Jun. 16, 2009

(54) REDUCTION OF CARBON INCLUSIONS IN SUBLIMATION GROWN SIC SINGLE CRYSTALS

(75) Inventors: Avinash K. Gupta, Basking Ridge, NJ (US); Edward Semenas, Allentown, PA (US); Ilya Zwieback, Washington Township, NJ (US)

(73) Assignee: II-VI Incorporated, Saxonburg, PA (US)

(*) Notice: Subject to any disclaimer, the term of this patent is extended or adjusted under 35 U.S.C. 154(b) by 0 days.

(21) Appl. No.: 11/904,593

(22) Filed: Sep. 27, 2007

(65) Prior Publication Data

US 2008/0115719 A1  May 22, 2008

Related U.S. Application Data

(60) Provisional application No. 60/847,558, filed on Sep. 27, 2006.

(51) Int. Cl.
*C30B 25/12* (2006.01)

(52) U.S. Cl. .............................. 117/90; 117/84; 117/88; 117/89; 117/92

(58) Field of Classification Search ................... 117/84, 117/88, 89, 90, 92
See application file for complete search history.

(56) References Cited

U.S. PATENT DOCUMENTS 6,406,539 B1 * 6/2002 Shigeto et al. ................ 117/88

* cited by examiner

*Primary Examiner*—Felisa C Hiteshew
(74) *Attorney, Agent, or Firm*—The Webb Law Firm (57) ABSTRACT

In a method of SiC single crystal growth, a SiC single crystal seed and polycrystalline SiC source material are provided in spaced relation inside of a graphite growth crucible along with at least one compound capable of forming SiO gas in the growth crucible. The growth crucible is heated whereupon the gaseous SiO forms and reacts with carbon in the growth crucible thereby avoiding the introduction of carbon into the SiC single crystal before and during the growth thereof and the SiC source material vaporizes and is transported via a temperature gradient in the growth crucible to the seed crystal where it precipitates and forms a SiC single crystal.

13 Claims, 5 Drawing Sheets

REDUCTION OF CARBON INCLUSIONS IN SUBLIMATION GROWN SIC SINGLE CRYSTALS

CROSS REFERENCE TO RELATED APPLICATION

This application claims priority from U.S. Provisional Patent Application No. 60/847,558, filed Sep. 27, 2006, the contents of which are incorporated herein by reference.

BACKGROUND OF THE INVENTION

1. Field of the Invention

The present invention relates to the growth of high quality SiC single crystals.

2. Description of Related Art

Silicon carbide is an important wide-bandgap material used for the development and manufacturing of semiconductor devices of new generation. Wafers of silicon carbide of 4H and 6H polytypes serve as lattice-matched substrates to grow epitaxial layers of SiC and AlGaN, which are used for the fabrication of SiC— and AlGaN-based devices. While AlGaN-based devices are intended for operation at microwave frequencies, SiC-based devices are aimed at efficient power switching. In order to produce low-defect epilayers and high-quality devices, the substrates of these devices must have good crystal quality, that is, they must contain low densities of inclusions, micropipes, sub-grains and other defects.

Figure 1:
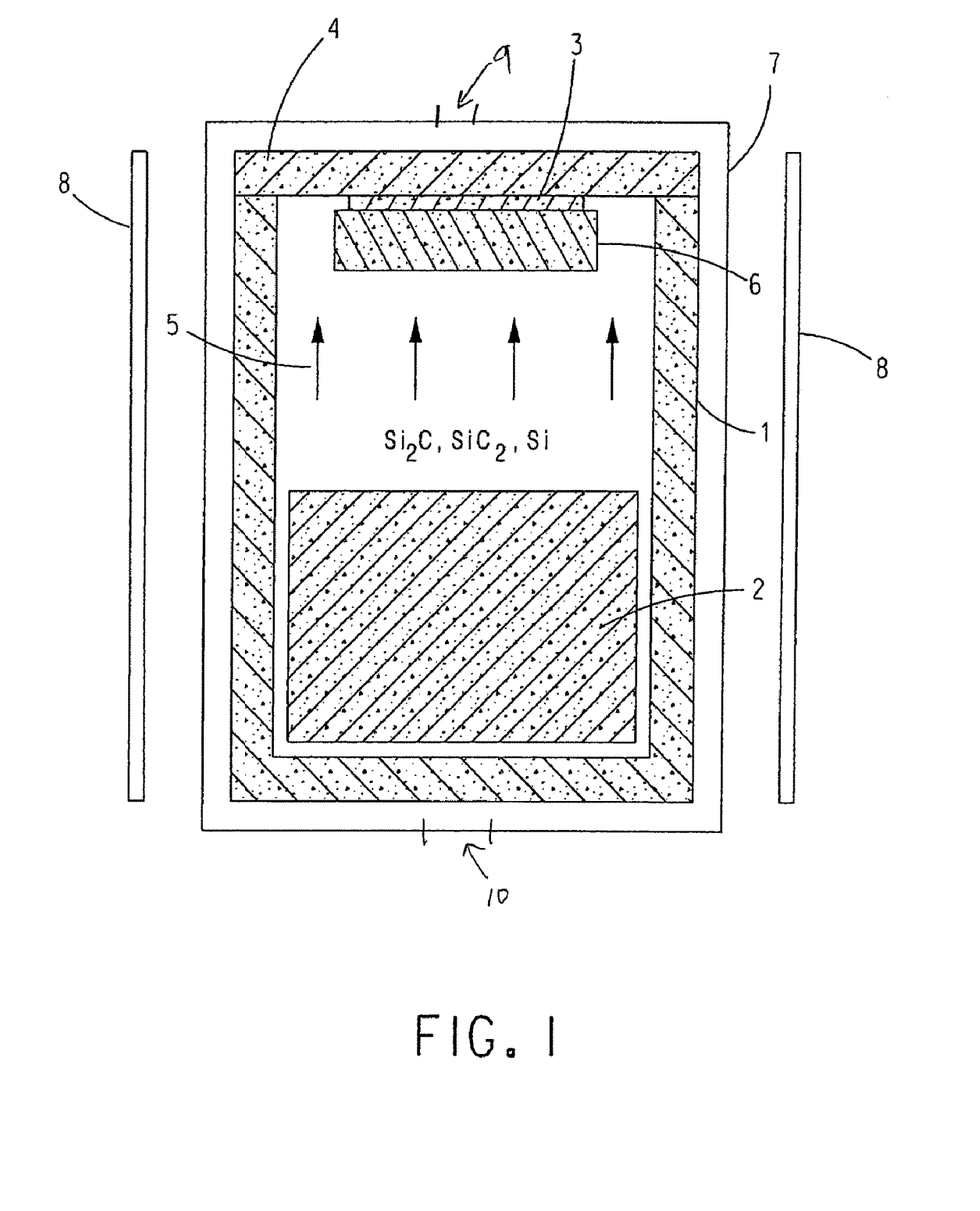
FIG. 1 is a schematic diagram of a silicon carbide (SiC) sublimation growth system.

On the industrial scale, single crystals of silicon carbide are grown by sublimation. A schematic diagram of a SiC sublimation growth system is shown in FIG. 1. In the preparation for growth, a graphite crucible 1 is loaded with a polycrystalline SiC source 2 and a SiC single crystal seed 3. Typically, source 2 is placed at the bottom of the growth crucible 1, while seed 3, typically having the shape of a plate or wafer, is attached to a lid 4 of crucible 1, which lid 4 serves as a seed holder and is also made of graphite. Loaded crucible 1 is placed inside a gastight growth chamber 7. Then, crucible 1 is filled with an inert gas, such as, without limitation, argon or helium, in any suitable and/or desirable manner and heated to a growth temperature, which can be between 2000 and 2400° C., by a suitable heating means 8, such as, without limitation, an RF coil. Desirably, chamber 7 is made from fused silica. At growth temperature, source 2 vaporizes and fills the interior of the crucible 1 with a vapor 5 comprising volatile molecular species $Si_2C$, $SiC_2$ and Si. During growth, the temperature of source 2 is kept higher than the temperature of seed 3. This temperature gradient forces vapor 5 species to migrate toward seed 3 and precipitate thereon causing growth of a SiC single crystal 6. In order to control the growth rate and ensure high crystal quality, PVT growth is carried out in a flow of low pressure inert gas, such as argon or helium, inside crucible 1, generally at a pressure between 1 and 200 Torr. The flow of inert gas can be introduced into the crucible 1 in any suitable and/or desirable manner known in the art. For example, the flow of the inert gas can be introduced into crucible 1 via the porous walls thereof by way of a gas inlet 9 and a gas outlet 10 of sealed chamber 7.

Figure 2A:
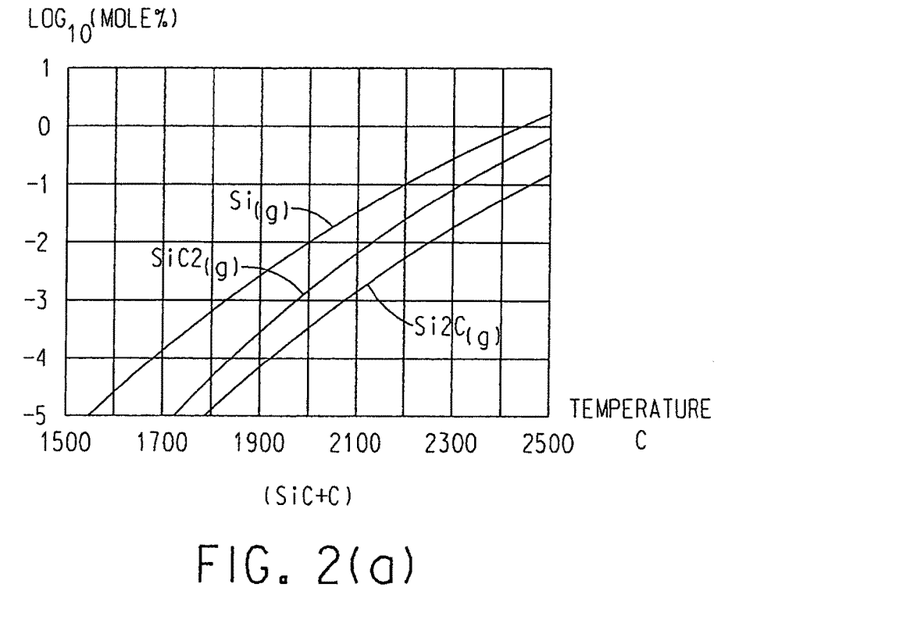
FIGS. 2(a) and 2(b) are plots of $\log_{10}$ equilibrium compositions of gaseous products over solid SiC versus temperature for an SiC+C system and an SiC+Si system, respectively, that occur during SiC single crystal sublimation growth in a sublimation growth system of the type shown schematically in FIG. 1.

From the standpoint of thermodynamics, two general cases are possible that describe equilibria within crucible 1 at high temperatures: (i) SiC is in equilibrium with carbon and (ii) SiC is in equilibrium with liquid silicon. Based on thermodynamic calculations, the composition of the vapor phase comprising Si, $Si_2C$ and $SiC_2$ gaseous molecules in the SiC+C and SiC+Si systems are shown in FIGS. 2(a) and 2(b), respectively.

Sublimation growth of SiC single crystal 6 is generally carried out in a graphite crucible, such as graphite crucible 1. This creates a carbon-rich growth environment in which the pressure and composition of the vapor phase corresponds, generally, to the three-phase equilibrium between the vapor, SiC and C (shown in FIG. 2(a)). Under such conditions, simultaneous crystallization of SiC and C is possible and can lead to the formation of carbon inclusions in crystal 6. There are also other potential sources of carbon contamination of the growth interface and carbon inclusions in crystal 6. They include: (i) carbon particles that can be transported by the gas flow to the growing crystal 6 from the carbonized SiC source 2 and (ii) carbon particles that can be generated as a result of the erosion of the graphite of crucible 1 by the aggressive Si-rich vapor.

Figure 3:
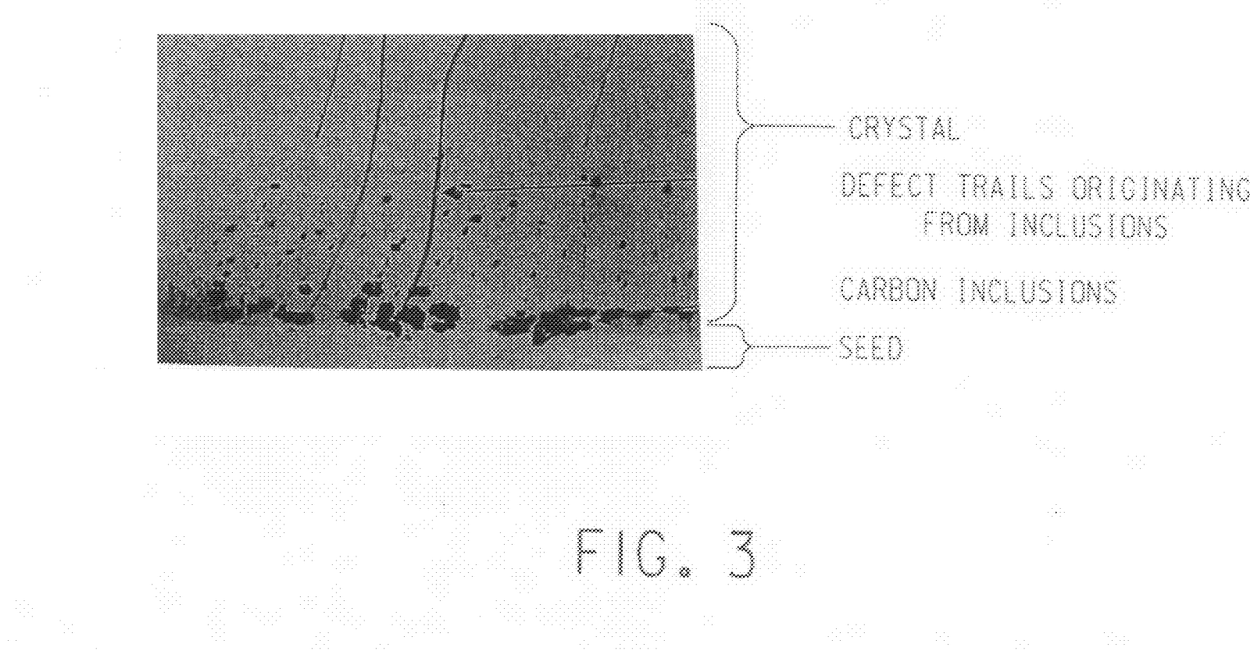
FIG. 3 is a photograph of a magnified cross section of a 6H-SiC single crystal (grown in a sublimation growth system of the type shown schematically in FIG. 1 in accordance with a prior art sublimation growth method) including carbon inclusions and defect trails that originate from the carbon inclusions.

It is believed that the incidence of carbon inclusions in crystals, e.g., crystal 6, grown conventionally using the techniques of the prior art is quite high. A photograph showing a cross section of one of such 6H—SiC single crystal under ×25 magnification is shown in FIG. 3. The photograph of FIG. 3 shows inclusions near the seed-crystal interface, as well as trails of macro-defects originating from the inclusions. Chemical Auger analysis showed that these inclusions comprise carbon. In addition to macro-defects, the presence of carbon inclusions in the crystal bulk causes the appearance of microscopic defects, such as micropipes and dislocations.

Figure 2B:
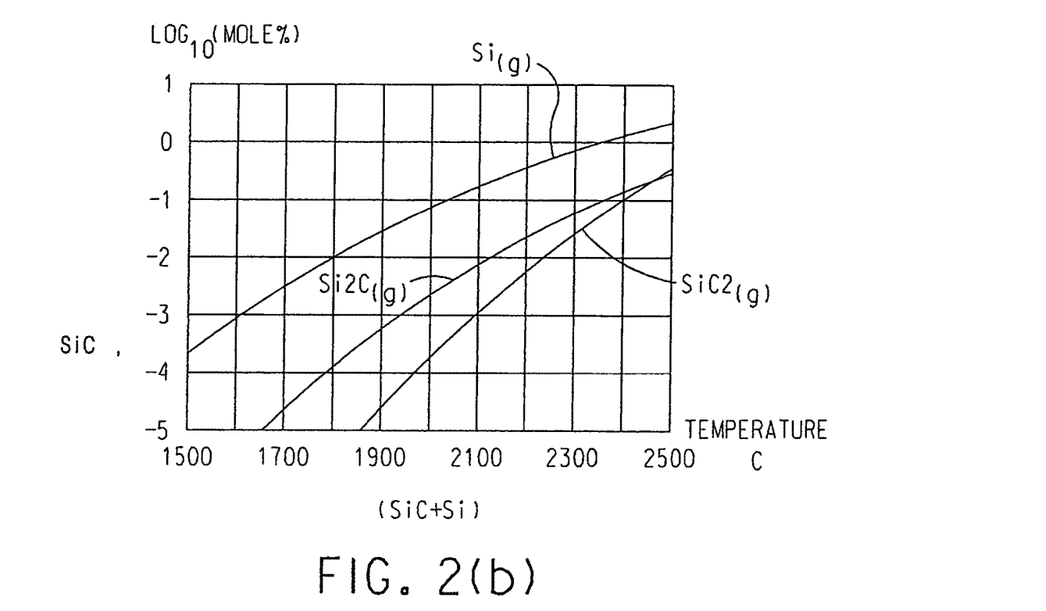

It is believed that the presence of carbon inclusions can be reduced if the growth atmosphere is silicon rich with its composition corresponding to the SiC+Si equilibrium shown in FIG. 2(b). Adding elemental silicon to the SiC source was heretofore believed to be the most straightforward way to achieve this. Unfortunately, in the case of SiC+Si equilibrium, simultaneous crystallization of SiC and Si can take place leading to the appearance of silicon inclusions. In addition, an excess of silicon in the crystal growth charge, i.e., source 2, can lead to strong erosion of graphite parts. Finally, over-stoichiometric silicon lasts in the crystal growth crucible only for a short period of time due to the high vapor pressure over elemental silicon.

Accordingly, it would be desirable to find an additive to the crystal growth charge that does not alter significantly the SiC ratio in the vapor phase, but which would remove the carbon contaminants from the growth interface.

SUMMARY OF THE INVENTION

One embodiment of a SiC single crystal growth method includes (a) providing a SiC single crystal seed and polycrystalline SiC source material in spaced relation inside of a graphite growth crucible; (b) providing in the growth crucible at least one compound capable of forming SiO gas in the growth crucible; and (c) heating the growth crucible whereupon the SiO gas forms and reacts with carbon in the growth crucible thereby avoiding the introduction of carbon into the SiC single crystal during the growth thereof and the SiC source material vaporizes and is transported via a temperature gradient in the growth crucible to the seed crystal where it precipitates and forms a SiC single crystal.

The one compound in step (b) can be solid SiO. The solid SiO can be added to the SiC source material in an amount between 0.01% and 5% of the weight of the SiC source material.

The one compound in step (b) can be solid $SiO_2$. The solid $SiO_2$ can be added to the SiC source material in an amount between either 0.01% and 10%, or 0.1% and 5% of the weight of the SiC source material.

Step (c) can occur in the presence of a flow of an inert gas inside the growth crucible. The pressure of inert gas inside the growth crucible can be between 1 Torr and 200 Torr. The inert gas can be argon or helium.

The one compound in step (b) can be CO gas. The concentration of the CO gas in the crystal growth atmosphere can be between either 0.1% and 10%, or 1% and 5%.

The at least one compound in step (b) can be comprised of any one or combination of the following: SiO which is introduced into the growth chamber in solid form at a temperature below growth temperature; $SiO_2$ which is introduced into the growth chamber in solid form at a temperature below growth temperature; and CO which is introduced into the growth chamber at growth temperature Another embodiment of a SiC single crystal growth method includes (a) providing in a graphite growth crucible the combination of a SiC single crystal seed, polycrystalline SiC source material, and a plurality of compounds capable of forming SiO gas in the growth crucible at different temperatures, with the SiC single crystal seed and the polycrystalline SiC source material disposed in the growth crucible in a manner to facilitate the growth of a SiC single crystal on the SiC seed crystal; (b) heating the growth crucible to a temperature below that where the SiC source material sublimates but where a first compound causes a first quantity of SiO gas to form that removes carbon from a surface of the SiC single crystal seed; and (c) heating the growth crucible to the growth temperature wherein: the SiC source material sublimates to form a SiC gas which precipitates on the SiC seed crystal to form the SiC single crystal; and a second compound causes a second quantity of SiO gas to form that removes carbon from where the SiC single crystal forms.

Steps (b) and/or (c) can occur in the presence of between 1 Torr and 200 Torr of an inert gas inside the growth crucible. The inert gas can be argon or helium.

The first compound can be a solid form of at least one of SiO or $SiO_2$ that is provided in the interior of the growth crucible prior to heating the growth crucible in steps (b) and (c). The solid form of the at least one of SiO or $SiO_2$ can be admixed with a powered form of the SiC source material.

The second compound can be a gaseous form of CO that is added to the interior of the growth crucible during step (c).

DETAILED DESCRIPTION OF THE INVENTION

With continuing reference to the growth system shown in FIG. 1 and described above, to eliminate or reduce the presence of carbon contaminants on the seed surface, on the SiC crystal growth interface and carbon inclusions in sublimation-grown SiC single crystals, such as crystal 6, gaseous silicon monoxide (SiO) is introduced into the growth atmosphere. The effect of the SiO additive to the SiC growth atmosphere can be understood from the following. Inside crucible 1, gaseous SiO reacts with carbon according to the following reaction:

$$SiO(gas)+C(solid) \Leftrightarrow SiC(solid)+CO(gas) \qquad EQ\ (1a)$$

EQ (1a) shows that in conditions of SiC sublimation growth gaseous SiO inside crucible 1 acts as a carbon "scavenger", attacking carbon and converting it into a solid silicon carbide, thus removing carbon contaminants from the seed surface prior to growth and from the SiC crystal growth interface during growth. This leads to the growth of SiC single crystals substantially free of carbon inclusions in the bulk.

Gaseous SiO can be introduced to the crucible atmosphere by adding solid SiO (silicon monoxide) to the SiC source 2 when charging crucible 1 therewith. The amount of SiO added to source 2 is, desirably, between 0.01% and 5%, of the weight of SiC source 2. Desirably, the compound SiO is added to the charge in the form of pure SiO powder.

During heating of crucible I to SiC single crystal growth temperatures in the presence of a flow of inert gas in crucible 1, as the temperature of crucible 1 increases to 800-1200° C., the solid SiO vaporizes and fills the interior of growth crucible 1 with SiO gas. The gaseous SiO reacts with carbon (C) contaminants that are present on the surface of seed crystal 3, thus removing C from the surface of seed crystal 3 in preparation for the subsequent growth of single crystal 6, which starts at higher temperatures. CO gas, which is a byproduct of the reaction between gaseous SiO and C in crucible 1, such as C present on the surface of seed crystal 3, escapes from the graphite growth crucible by infiltrating across the porous walls of growth crucible 1.

The addition of solid SiO to SiC source 2 can be effective for removing initial carbon contamination that may be present on the surface of seed crystal 3. An example of such initial carbon contamination can be the so-called "diamond background" due to the polishing of seed crystal 3 with various diamond slurries.

By the time the temperature in growth crucible 1 reaches 1200-1300° C., however, any solid SiO present in SiC source 2 would be expected to be completely evaporated and escaped from crucible 1 via the porous graphite forming crucible 1. At these and higher temperatures, however, additional contamination of the surface of seed crystal 3 with carbon can still occur. One source of such contamination can be carbon emitted from the graphite forming growth crucible 1. Therefore, an additional process is desirable which removes carbon contaminants from the surface of seed crystal 3 at higher temperatures.

One such additional process includes adding gaseous SiO to the atmosphere of crucible 1 at higher temperatures by adding solid $SiO_2$ (silica) to SiC source 2 when charging crucible 1 therewith. The amount of solid $SiO_2$ added to SiC source 2 is desirably between 0.01% and 10%, and, more desirably, between 0.1% and 5% of the weight of SiC source 2. Desirably, silica in the form of quartz sand, quartz particles, fused silica powder, fused silica lumps or particles is added to SiC source 2

As is common in SiC sublimation growth in the presence of inert gas, growth crucible 1 containing source 2 and seed crystal 3 is heated to growth temperatures in such a fashion that two temperature zones are created inside the crucible, i.e., a temperature gradient exists in growth crucible 1. A zone of higher temperatures is created at the bottom of crucible 1 where the SiC source 2 with the solid $SiO_2$ additive is located, while a zone of lower temperatures is created at the top of crucible 1, i.e., at or near lid 4, where the SiC seed crystal 3 is disposed. At temperatures approaching the Si melting point (1460° C.), the solid $SiO_2$ additive starts reacting with SiC source 2 and/or with carbon of the graphite forming crucible 1 yielding gaseous SiO and CO in accordance with the following reactions:

EQ (1b)

EQ (1c)

EQ (1d)

EQ (1e)

Gaseous SiO is produced in the higher temperature region of crucible 1 where the solid $SiO_2$ additive is in contact with: SiC source 2, any C that may be present in SiC source 2 or with carbon of the graphite forming crucible 1. The gaseous SiO migrates to the lower temperature within crucible 1 where seed crystal 3 is located and reacts with carbon (C) contaminants on the surface of seed crystal 3 converting them into SiC. This leads to efficient cleaning of carbon contaminants from the surface of SiC seed crystal 3. The CO gas, which is a byproduct of this reaction, escapes from growth crucible 1 by infiltrating across the porous graphite wall of crucible 1.

As the temperature inside crucible 1 approaches or exceeds 1800° C., any solid $SiO_2$ present in SiC source 2 would be expected to be completely consumed in chemical reactions described by EQs (1b)-(1e). However, at this and higher temperatures of SiC sublimation growth, additional contamination of the surface of seed crystal 2 with carbon can still occur and lead to the appearance of carbon inclusions in the bulk of crystal 6 growing on seed crystal 2. Therefore, yet another process suitable for cleaning the crystal growth interface is desirable.

One such process includes adding gaseous carbon monoxide, CO, into the inert gas atmosphere inside crucible 1 at the growth temperatures of crystal 6 on seed crystal 2.

In order to understand the effect of the CO additive to the gas phase on the reactions in the growth crucible, reference is made to EQ (1a), which is copied below:

EQ (1a)

Figure 4:
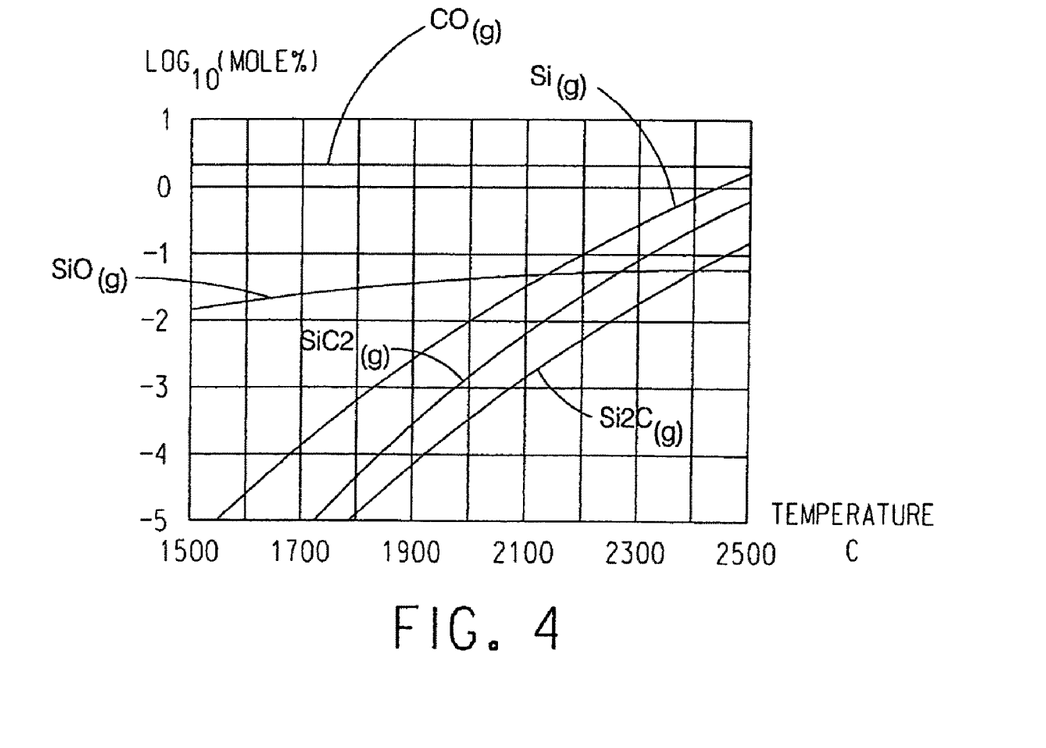
FIG. 4 is a plot of $\log_{10}$ equilibrium compositions of gaseous products over solid SiC versus temperature for the gaseous products CO, SiO, Si, $SiC_2$, and $Si_2C$ that occur during SiC single crystal sublimation growth in a sublimation growth system of the type shown FIG. 1.

EQ (1a) describes three-phase equilibrium between two solid phases (SiC and C) and the gas phase, which is a mixture of two gases, SiO and CO. The equilibrium constant of this reaction depends on the temperature. Therefore, the equilibrium gas phase composition in the two temperature zones of the crucible will be different. Thermodynamic calculations show that with increase in the temperature, the amount of SiO in the gas phase increases, as shown in FIG. 4.

This means in-turn that the pressure of SiO adjacent SiC source 2 (which is disposed in the higher-temperature zone of crucible 1) is higher than the pressure of SiO adjacent growing crystal 6 (which is disposed in the lower-temperature zone of crucible 1). Therefore, gaseous SiO will migrate in a direction from SiC source 2 to growing crystal 6, increase its pressure adjacent crystal 6 above the equilibrium and shift the reaction of equation EQ (1a) from left to right, that is, toward conversion of C into SiC. Thus, in the conditions of SiC sublimation growth, the addition of CO to the gas phase in the interior of crucible 1 leads to the formation of gaseous SiO and removal of carbon contaminants from the growth interface of crystal 6. This leads to the growth of SiC crystal 6 substantially free of carbon inclusions.

The growth of crystal 6 on seed crystal 2 occurs in the presence of a flow of a mixture of inert gas and carbon monoxide gas inside growth crucible 1. The pressure of inert gas inside the growth crucible can be between 1 Torr and 200 Torr. The inert gas can include argon or helium. The concentration of carbon monoxide in the inert gas can be between 0.1% and 10% and, more desirably, between 1% and 5%.

Elimination or dramatic reduction of carbon inclusions in sublimation-grown SiC single crystals will lead to improved crystal quality, reduced defect densities, improved electrical parameters of SiC substrates and higher yields.

A SiC single crystal growth run performed with only solid $SiO_2$ added to the SiC source 2 was carried out in a crucible 1 made of pure, isostatically molded and low-porosity graphite "ATJ". A standard 2 inch diameter 6H-SiC wafer was used as the seed 3. The wafer was 400 microns thick and oriented parallel to the (0001) crystallographic plane. The wafer faces were lapped and polished in accordance with accepted procedures of seed 3 preparation. Seed 3 was affixed to lid 4 of crucible 1 using a high-temperature carbonaceous adhesive.

Pure polycrystalline SiC with the grain size of 0.5 to 2 mm produced by direct high-temperature synthesis between elemental silicon and carbon was used as the SiC source 2. The source weight was 400 gram. 5 gram of synthetic silica powder ($SiO_2$) of nominal purity of 99.9999% was admixed to the SiC source 2, thus constituting 1.25% of the weight of source 2. The growth process was carried out at temperatures of about 2000° C. (seed 3) and 2050° C. (source 2). The growth atmosphere inside crucible 1 was argon under pressure of 10 Torr.

Figure 5:
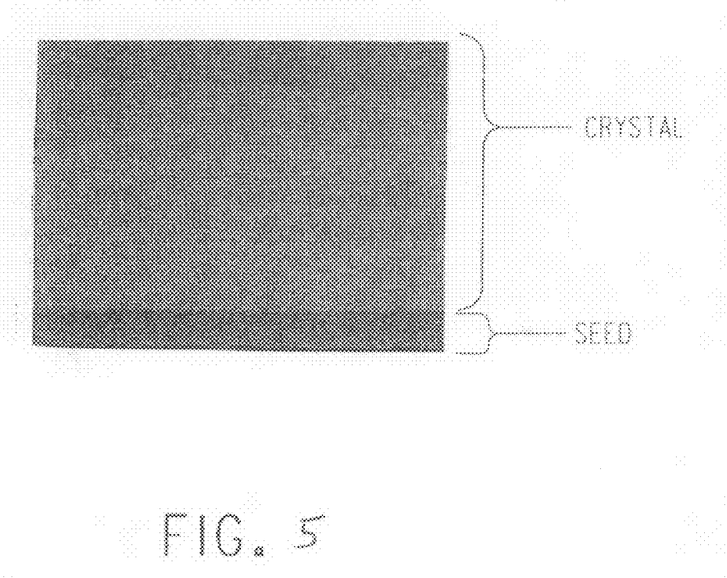
FIG. 5 is a photograph of a magnified cross section of a 6H-SiC single crystal (grown in a sublimation growth system of the type shown in FIG. 1 in accordance with the embodiment of the sublimation growth method disclosed in the following detailed description of the invention) showing, in contrast to the cross section of FIG. 3, the absence of carbon inclusions and defect trails.

The grown crystal 6 was inspected under a microscope. The inspection showed neither carbon contamination at the seed-crystal interface, nor inclusions in the bulk of crystal 6. Finally, a polished cross section was prepared from the grown crystal 6. A photograph of this cross section made under a microscope is shown in FIG. 5. This figure shows that the bulk of crystal 6 contains neither carbon inclusions nor macro-defects that could be associated with such inclusions.

It is believed that the use of solid SiO and gaseous CO in the manner described above, either individually or in combination with each other and/or with solid $SiO_2$, would further avoid the formation of carbon inclusion in the grown crystal 6. To this end, it is envisioned that any one or combination of solid $SiO_2$, solid SiO and gaseous CO could be used in the manner described above to avoid the formation of carbon inclusion in the grown crystal 6.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A SiC single crystal growth method comprising:
   (a) providing a SiC single crystal seed and a polycrystalline SiC source material in spaced relation inside of a graphite growth crucible;
   (b) providing in the growth crucible at least one compound capable of forming SiO gas in the growth crucible during growth of a SiC single crystal on the seed crystal; and
   (c) heating the growth crucible whereupon the SiO gas forms and reacts with carbon in the growth crucible thereby avoiding the introduction of carbon into the SiC single crystal before and during the growth thereof and the SiC source material vaporizes and is transported via a temperature gradient in the growth crucible to the seed crystal where it precipitates and forms a SiC single crystal.

2. The method of claim 1, wherein step (c) occurs in the presence of a flow of an inert gas inside the growth crucible.

3. The method of claim 2, wherein the pressure of inert gas inside the growth crucible is between 1 Torr and 200 Torr.

4. The method of claim 2, wherein the inert gas is argon or helium.

5. The method of claim 1, wherein the one compound in step (b) is CO gas.

6. The method of claim 5, wherein the concentration of the CO gas in the crystal growth atmosphere is between either 0.1% and 10%, or 1% and 5%.

7. The method of claim 1, wherein the compound is CO gas.

8. A SiC single crystal growth method comprising:
   (a) providing in a graphite growth crucible the combination of a SiC single crystal seed, polycrystalline SiC source material, and a plurality of compounds capable of forming SiO gas in the growth crucible at different temperatures, with the SiC single crystal seed and the polycrystalline SiC source material disposed in the growth crucible in a manner to facilitate the growth of a SiC single crystal on the SiC seed crystal;
   (b) heating the growth crucible to a temperature below that where the SiC source material sublimates but where a first compound causes a first quantity of SiO gas to form that removes carbon from a surface of the SiC single crystal seed; and
   (c) heating the growth crucible to the growth temperature wherein:
   the SiC source material sublimates to form a SiC gas which precipitates on the SiC seed crystal to form the SiC single crystal; and
   a second compound causes a second quantity of SiO gas to form that removes carbon from where the SiC single crystal forms.

9. The method of claim 8, wherein steps (b) and (c) occur in the presence of between 1 Torr and 200 Torr of an inert gas inside the growth crucible.

10. The method of claim 8, wherein the inert gas is argon or helium.

11. The method of claim 8, wherein the first compound is a solid form of at least one of SiO or $SiO_2$ that is provided in the interior of the growth crucible prior to heating the growth crucible in steps (b) and (c).

12. The method of claim 11, wherein the solid form of the at least one of SiO or $SiO_2$ is admixed with a powered form of the SiC source material.

13. The method of claim 8, wherein the second compound is a gaseous form of CO that is added to the interior of the growth crucible during step (c).

* * * * *

UNITED STATES PATENT AND TRADEMARK OFFICE
CERTIFICATE OF CORRECTION

PATENT NO. : 7,547,360 B2  Page 1 of 1
APPLICATION NO. : 11/904593
DATED : June 16, 2009
INVENTOR(S) : Gupta et al.

It is certified that error appears in the above-identified patent and that said Letters Patent is hereby corrected as shown below:

On the Title Pg, Item (56) References Cited, U.S PATENT DOCUMENTS, add the following:

-- 7,387,679 B2   6/17/2008     Maruyama et al. 117/107 --

Signed and Sealed this

Fifteenth Day of September, 2009

David J. Kappos
*Director of the United States Patent and Trademark Office*